(12) United States Patent
Drewery

(10) Patent No.: US 6,537,421 B2
(45) Date of Patent: Mar. 25, 2003

(54) RF BIAS CONTROL IN PLASMA DEPOSITION AND ETCH SYSTEMS WITH MULTIPLE RF POWER SOURCES

(75) Inventor: John Drewery, Alameda, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/911,654

(22) Filed: Jul. 24, 2001

(65) Prior Publication Data

US 2003/0019581 A1 Jan. 30, 2003

(51) Int. Cl.[7] .................................................. H05H 1/00
(52) U.S. Cl. ............................. 156/345.48; 156/345.28
(58) Field of Search ..................... 156/345.48, 345.44, 156/345.28

(56) References Cited

U.S. PATENT DOCUMENTS

| | | |
|---|---|---|
| 4,464,223 A | 8/1984 | Gorin |
| 4,844,775 A | 7/1989 | Keeble |
| 4,863,549 A | 9/1989 | Grunwald |
| 6,080,287 A | 6/2000 | Drewery |
| 6,095,084 A * | 8/2000 | Shamouilian et al. .... 118/723 E |
| 6,117,279 A | 9/2000 | Smolanoff et al. |

OTHER PUBLICATIONS

Berry et al., *Control of the radio–frequency wave form at the chuck of an industrial oxide–etch reactor*, J. Vac. Sci. Technol. A 18(6), Nov./Dec. 2000 pp. 2806–2814.

* cited by examiner

Primary Examiner—Thi Dang
(74) Attorney, Agent, or Firm—Wood, Herron & Evans, L.L.P.

(57) ABSTRACT

A method and apparatus are provided by which the effects of the plasma power RF source and substrate bias are decoupled to reduce the effect of plasma power on the wafer bias and to improve process control. A technique is provided that includes establishing a high density plasma adjacent to a semiconductor wafer, such as by inductive coupling, at some RF plasma excitation frequency, preferably at a frequency between 50 kHz and 50 MHz. RF power from a bias power source is applied to a chuck on which a wafer is supported which exhibits high capacitance between the RF feed of the bias power source and the wafer. The RF power to the substrate support is applied through a matching unit at a frequency that is identical to or close to that of the frequency of the primary power to the plasma. Series resonant filters are connected between the RF bias power source connection to the substrate support and ground, the resonant frequencies preferably being set to harmonics of the primary power source frequency to suppress voltage components on the substrate support at these frequencies.

18 Claims, 2 Drawing Sheets

RF BIAS CONTROL IN PLASMA DEPOSITION AND ETCH SYSTEMS WITH MULTIPLE RF POWER SOURCES

This invention relates to semiconductor wafer plasma processing and particularly to inductively coupled plasma (IPC) and other processes in which multiple sources of RF power are present.

BACKGROUND OF THE INVENTION

In certain equipment used to deposit thin films on semiconductor wafers in the manufacture of semiconductor devices or to etch the films on, or surfaces of, such wafers, plasmas are often generated for processing the wafer. Such plasmas include inductively coupled plasmas (ICPs) and plasmas that are otherwise coupled into the processing space of a vacuum chamber of the equipment from a primary RF source. Often, too, a secondary RF source is used to apply bias to the semiconductor wafer being processed in the chamber by the plasma. Ions are extracted from the plasma energized by the primary RF source by a DC field within a sheath that forms between the wafer and the plasma as a result of the RF bias that is applied to it from the secondary RF source. These ions modify the surface of the wafer, for example, by coating it, by etching it or by modifying the properties of a film that has been or is being deposited. In some cases, the deposition material itself is ionized, for example, as in the case of ionized physical vapor deposition (iPVD), so that material being deposited on the wafer can be accelerated normal to the wafer surface.

In such equipment, it is helpful to control the DC bias on a substrate, particularly in a high density inductively coupled plasma system where the plasma of such systems can itself lead to the appearance of an otherwise unwanted DC bias on the wafer. The unwanted bias can lead to detrimental effects on process performance. Furthermore, where RF bias from a secondary source is used to deliberately create a bias on the wafer, the additional bias from the plasma makes the required bias power for an optimum process develop a dependence on the ICP behavior. Variations in ICP properties can lead to a complex dependence of the process on the relative ICP and bias powers as well as other process parameters, including operating pressure.

Primary plasma properties are dependent on certain process parameters. For example, increasing process pressure in the range below 100–200 mTorr will generally increase plasma ion density and lower electron temperature. Increasing the power applied to the plasma from the primary RF source usually increases the ion density and electron density of the plasma. The effects seen on the wafer are a function of these plasma properties combined with the effects of the secondary RF power that is applied to bias the wafer. This secondary power, referred to herein as the "bias power", generates a "bias voltage" on the wafer whose magnitude depends on the electron temperature and the plasma density, via the "plasma potential".

In the development of a process, it is desirable that the effects of changing process parameters be separable. That bias power should significantly affect the plasma is undesirable because this renders the system more complex and its understanding more difficult to master. That the primary RF power to the plasma and its excitation system have the effect of changing the effective bias voltage on the substrate is also undesirable. The results of process changes are easier to predict when the primary plasma power source can be regarded as an essentially passive reservoir of ions that are then extracted by the DC component of the sheath field, and it can be assumed that the primary power to the plasma is not itself a source of bias power to the substrate.

In most plasma systems of this type, however, this is not the case. Instead, the primary power source for the plasma leads to the appearance of RF voltage on the wafer and the wafer supporting chuck, at both the fundamental frequency of excitation of the primary plasma source (the "primary frequency") and its harmonics. The coupling of the fundamental frequency from the primary plasma power source to the wafer often occurs by capacitive coupling, with the effect of transmission of the voltage variations of the exciting primary power electrode being through the plasma to the wafer on the support. Harmonics are transmitted from the primary power source to the wafer because of the non-linear nature of the sheath on capacitive coupling, as well as from effects such as the fluctuation in plasma density as a function of time, and the RF Hall effect that is present in cases where high RF magnetic fields exist. The combination of these effects leads to an effective RF source within the plasma that can affect parameters such as the DC wafer bias which are critical for process control.

Accordingly, there is a need to eliminate the mutual dependence of RF plasma properties on substrate bias potential, and for a technique by which the source of RF plasma power and substrate bias power can be decoupled, reducing the effect of plasma power and other plasma parameters on wafer bias, thereby improving process control.

SUMMARY OF THE INVENTION

A primary objective of the present invention is to improve process control in a biased substrate plasma processing system. A more particular objective of the invention is to provide a method and apparatus by which the effects of the plasma power RF source and substrate bias can be decoupled to reduce the effect of plasma power on the wafer bias.

According to principles of the present invention, unwanted parameter coupling between the plasma and the substrate is controlled, allowing for simpler process development and leading to more reliable and repeatable plasma processes.

According to certain embodiments of the invention, a technique is provided that includes establishing a high density plasma adjacent to a semiconductor wafer by excitation of the plasma at an RF frequency, preferably at between 50 kHz and 50 MHz and applying RF power from a bias power source to a wafer support or chuck that exhibits high capacitance between the RF feed of the bias power source and the wafer. The RF power to the substrate support is preferably applied through a matching unit at a frequency that is identical to or close to that of the frequency of the primary power to the plasma.

According to further embodiments of the invention, filters are added between the bias RF power source connection to the substrate support and ground to eliminate harmonics of the plasma power source. Preferably, the filters are series resonant filters or notch filters, the resonant frequencies of which are preferably set to harmonics of the plasma power source frequency to suppress voltage components on the substrate support at these frequencies.

These and other objectives and advantages of the present invention will be more readily apparent from the following detailed description.

DETAILED DESCRIPTION

Figure 1:
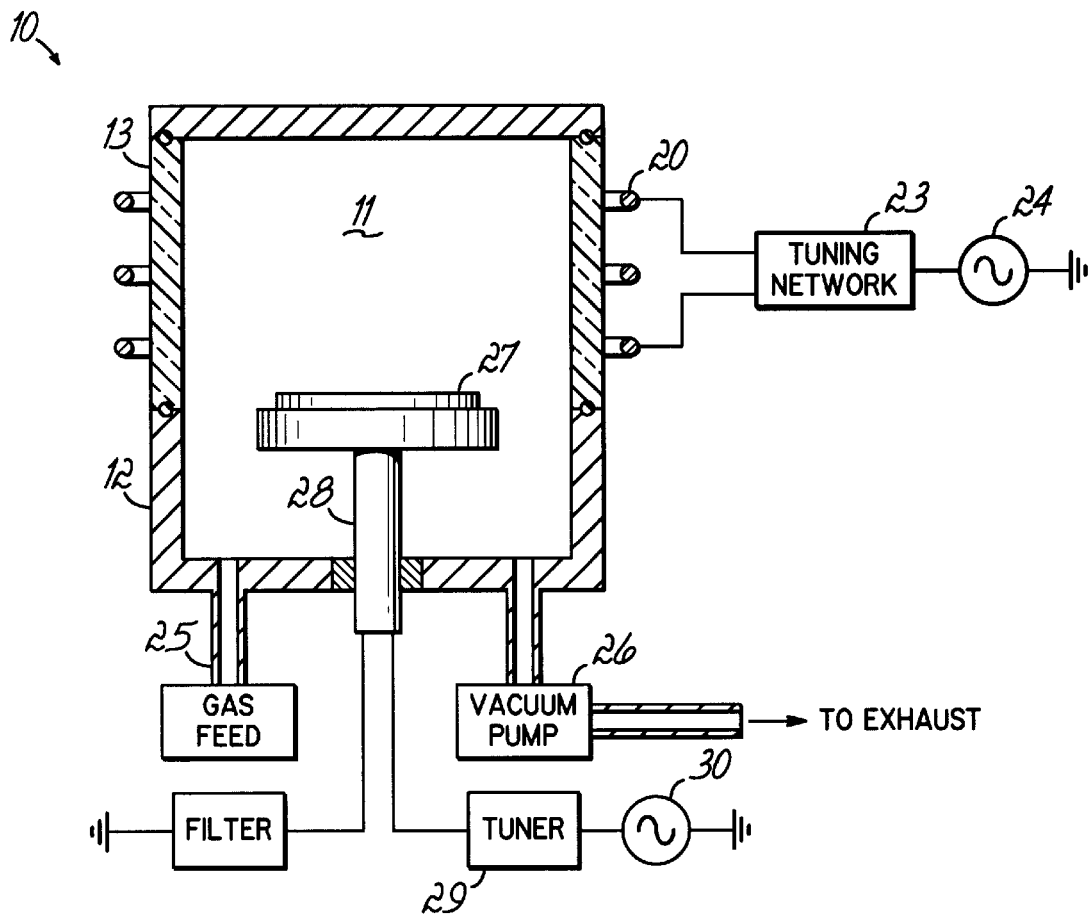
FIG. 1 is a diagrammatic view illustrating a system embodying principles of the present invention.

FIG. 1 illustrates one configuration of a system 10 embodying principles of the present invention. The system 10 includes a vacuum chamber 11 having a chamber wall 12, part of which includes a window 13 formed of quartz or some other material that is transparent to radio frequency waves at the operating frequencies of the system 10. A coil 20 is located outside of the chamber 11 and surrounds the window 13 and is powered by an RF generator 24 that is connected across the coil through a tuning network 23. The generator 24 in the system 10 is the primary plasma generating portion provided to energize the plasma in the chamber 11. The plasma could also be generated by a capacitive electrode immersed in the plasma or by an inductive coil immersed in the plasma. Alternatively, a helicon source can be used. Many other methods of generating a high density plasma with RF energy in the MF and HF frequency ranges are known to those skilled in the art.

Process gases are introduced into the chamber 11 through one or more tubes 25. A vacuum pump 26 is provided to exhaust gases from the chamber 11 and to establish a vacuum level within the chamber 11 that is suitable for the process that is being performed in the system 10. A wafer 27 is supported in the chamber 11 by a wafer support or chuck 28. The wafer 27 is supported on the chuck 28 in such a way that a capacitance exists between the wafer 27 and the chuck 28. This capacitance is large enough so that there is an insignificant drop in RF voltage between the chuck 28 and the wafer 27 during processes performed at all frequencies of interest. An RF bias generator 30 is provided that is distinct from the generator 24 and connected to the chuck 28 through a tuner 29 to supply RF power to the chuck 30.

Figure 2:
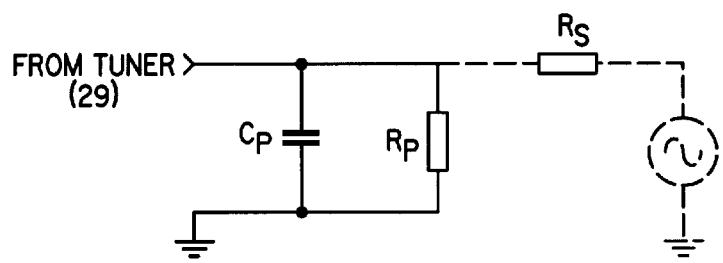
FIG. 2 is a simplified diagrammatic circuit representation of the plasma in the system of FIG. 1.

In systems of the type described above, the plasma density is sufficient for the plasma to present a low real impedance to the wafer 27. This is illustrated in FIG. 2, which is presented as an aid to explanation of the invention and shows a simple diagrammatic circuit representation of the plasma. The plasma resistance $R_p$ is smaller than the output impedance $R_s$ of the effective RF source within the plasma that leads to the unwanted RF components on the wafer 27.

In fact, $R_p$ and $R_s$ are complicated functions of the plasma parameters and are frequency dependent. $C_p$ represents the reactive component of the load presented by the plasma, which is dependent on stray capacitances between the wafer 27 and other surfaces within the chamber 11 as well as the capacitance of the plasma sheath.

The tuning network 29 consists of an arrangement of capacitors and inductors that is intended to transform the load presented by the plasma, at the specific frequency at which the wafer bias is applied, into a load compatible with the RF bias power generator 30. For the purposes of analysis, it can be assumed that the tuning network 29 transforms the load on the generator 30 to a value equal to the output impedance of the generator 30, in which case, all the power from the generator 30 is delivered from the load, except losses due to dissipation in the connecting cables and in the components of the tuner 29. Considering the circuit with the plasma as the source and the generator 30 and tuner 29 as the load, the impedance presented by the generator 30 as a load is the complex conjugate of the impedance presented by the plasma. So if the plasma load $R_p$ is small, and the tuner 29 matches the generator 30 to that load, then the load presented to the effective source of RF within the plasma is small compared with the output impedance of the effective source (where, as assumed, the tuning network 29 transforms the load on the generator 30 to a value equal to the output impedance of the generator 30). The component of voltage appearing on the wafer 27 at the frequency of operation of the bias generator 30 is then small.

Accordingly, a desirable frequency of operation of the bias power generator 30 is the frequency of operation of the primary RF power source 24 for the plasma.

If the wafer bias power source 30 is operated at that frequency, then the fundamental component of the voltage arising from the power source within the plasma is reduced by a factor of about $R_p/(R_p+R_s)$ relative to the voltage that would exist were the load presented by the tuner 29 and RF bias generator 30 much larger than $R_s$. There is therefore a range of frequencies of operation on either side of the frequency of the plasma power source 24, which leads to the presentation of a low load to the plasma at the plasma power source frequency. The width of the band of these frequencies depends on the component values of the tuner 29 as well as $R_p$. In this way, operation of the bias power supply 30 near the primary frequency leads to the suppression of the fundamental component of the RF source within the plasma.

Figure 3:
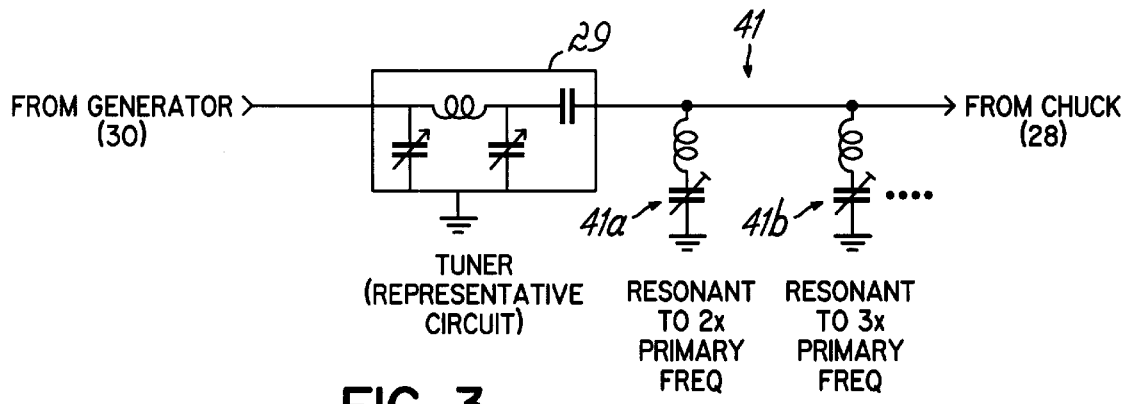
FIG. 3 is a circuit diagram of the filter portion of the system of FIG. 1

The tuner 29 in general presents a much higher impedance to the harmonics of the primary frequency than it does to the primary frequency. In many cases the tuner 29 appears as a capacitive load to the plasma. Suppression of these harmonics can be achieved by adding a filter 41 formed of series resonant elements 41a, 41b, . . . between the wafer support 28 and ground, as illustrated, for example, in FIG. 3. The simplest such circuit is the series inductor-capacitor combination, which functions as a notch filter. At frequencies low enough that the length of the connection from the support 28 to the tuner 29 is small compared to c/f, where c is the speed of light and f the frequency to be suppressed, that connection may usually be treated as an inductance and the filter values can then be adjusted to take into account this inductance. The filter or filters can then be physically located inside of or near the tuner 29 so that adjustment of the component values, such as by changing the value of a variable capacitor, may be carried out to minimize the unwanted RF component at this frequency. Filters can be added for as many frequency components as desired.

Figure 4:
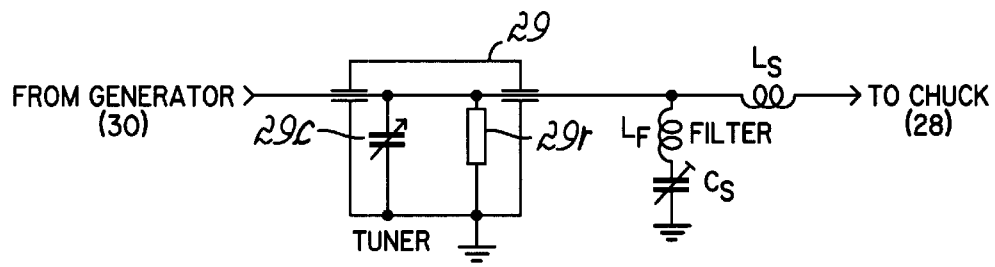
FIG. 4 is a simplified circuit representation of the diagram of FIG. 3.

The design of the tuner and filters is influenced by the fact that different tuner settings are needed for different primary plasma parameters. The tuner components can be set to different values, depending on the exact plasma conditions, by the controller of the system that controls the parameters. In FIG. 4, the tuner 29 has been replaced by a capacitor 29c and a resistor 29r that represent the complex impedance of the tuner 29. Tuning results in a variation of this capacitor 29c, which affects the voltage drop in $L_s$, and the inductance of the feed from tuner 29 to chuck, which affects the values of $L_f$ and $C_f$ needed to achieve the best rejection of the harmonic signal. The components of the tuner 29 and filter 41 are preferably chosen so that, over the expected tuning range of the tuner 29, the filter 41 operates adequately. Location of the filter 41 as close as possible to the chuck 30 reduces sensitivity to the settings of the tuner 29, although this positioning can introduce problems of accessibility for adjustment.

The procedure for setting up the filter 41 is as follows: With the elements 41a,41b, of filter 41 at some initial setting, the process is started with the tuner 29 being adjusted for zero power reflected to the bias generator 30. The variable components of the tuner 29 are then locked in position and the bias RF power supply 30 is replaced by a dummy load equal to the output impedance of the power supply 30. Using a spectrum analyzer, and running only the plasma power supply, the filter elements 41a,41b, may be adjusted to reduce components of the RF source within the primary plasma as desired. The bias supply 30 may then be reconnected in place of the dummy load. It may be necessary to run this procedure again, using the new settings of the filter components 41a,41b, as the starting point, to achieve optimal adjustment. This procedure assumes that the effect of the bias power 30 on the primary plasma is relatively small, as is the case in higher density plasma systems.

While the above description and accompanying drawings set forth various embodiments of the invention, it will be apparent to those skilled in the art that additions and modifications may be made without departing from the principles of the invention. Accordingly, what is claimed is:

1. A method of controlling the coupling between the bias on a substrate in a plasma processing apparatus and a high density RF plasma comprising:

establishing a high density plasma adjacent to a semiconductor wafer by excitation at an RF frequency of a process gas in said chamber with inductively coupling RF energy from an RF source;

applying RF power from an RF bias power source to the wafer on a wafer support to produce a bias potential on the wafer; and maintaining low coupling between the bias potential and the RF plasma by:

maintaining the RF bias power at a frequency that is approximately the same as said RF frequency of the plasma; and filtering the RF power to the wafer at the frequencies that are harmonics of said RF frequency to suppress voltage components on the wafer at said frequencies.

2. The method of claim 1 wherein:

the applying of RF power from a bias power source to the wafer is through a matching unit tuned to a frequency that is identical to that of said RF frequency.

3. The method of claim 1 wherein:

the applying of RF power from a bias power source to the wafer is through a matching unit connected to a substrate support on which the wafer is supported.

4. The method of claim 1 wherein:

the filtering of RF power to the wafer includes connecting one or more notch filters between the bias RF power source connection to a substrate support on which the wafer is supported and ground.

5. The method of claim 1 wherein:

the filtering of RF power to the wafer includes connecting one or more series resonant filters between the bias RF power source connection to a substrate support on which the wafer is supported and ground, each of the filters having a resonant frequency set to a harmonic of said RF frequency.

6. The method of claim 1 wherein:

the applying of RF power from a bias power source to the wafer is through a matching unit connected to a substrate support on which the wafer is supported and which exhibits high capacitance between the RF power source connection to the substrate support and the wafer.

7. The method of claim 1 wherein:

the establishing of the high density plasma includes inductively coupling power at said RF frequency to the plasma.

8. The method of claim 1 wherein:

the establishing of the high density plasma includes coupling RF power to the plasma at a frequency of between 50 kHz and 50 MHz.

9. A method of controlling RF coupling between the bias on a substrate in a plasma processing apparatus and the plasma comprising:

providing a plasma processing apparatus having a vacuum chamber, a substrate support in the vacuum chamber for supporting a semiconductor wafer thereon for processing, and an RF power source coupled into the chamber to establish, without using the substrate support as an electrode, a high density plasma adjacent to a semiconductor wafer on the support by excitation of the plasma at an RF frequency;

connecting an RF bias power source to the substrate support through a matching unit; and maintaining a bias potential on a wafer on the substrate support that is substantially decoupled from the plasma by:

delivering bias power from the RF bias power source at a frequency approximately at said RF frequency; and connecting one or more filters between the substrate support and ground configured for filtering therewith RF power to the wafer at the frequencies that are harmonics of said RF frequency to suppress voltage components on the wafer at said frequencies.

10. The method of claim 9 wherein:

the connecting of the filters includes connecting one or more series resonant filters between the bias RF power source connection to a substrate support and ground, each of the filters having a resonant frequency set to a harmonic of said RF frequency.

11. The method of claim 9 wherein:

the RF power source is inductively coupled into the chamber for establishing high density plasma in the chamber.

12. The method of claim 9 wherein:

the RF frequency is between 50 kHz and 50 MHz.

13. A method of limiting RF coupling between the bias on a substrate in a plasma processing apparatus and an RF plasma in a semiconductor wafer processing chamber comprising:

providing a plasma processing apparatus having a vacuum chamber having a substrate support therein for supporting a semiconductor wafer thereon for processing;

inductively coupling RF energy from an RF plasma power source at an RF frequency and into the chamber and establishing therewith a high density plasma adjacent to a semiconductor wafer on the support by excitation of the plasma;

applying RF bias power to the support from an RF bias power source that is distinct from the RF plasma power source;

reducing the coupling of RF energy from the RF plasma to the substrate support by connecting one or more resonant filters between the substrate support and ground and filtering therewith the harmonics of said RF frequency to suppress voltage components on the wafer at said frequencies.

14. The method of claim 13 wherein:

reducing the coupling includes operating the RF bias power source at a frequency approximately the same as said RF frequency.

15. The method of claim 13 wherein:

the connecting of the filters includes connecting the one or more series resonant filters between the substrate support and ground, each of the filters including a series resonant circuit having a resonant frequency set to a harmonic of said RF frequency.

16. The method of claim 9 wherein:

reducing the coupling includes operating the RF bias power source at a frequency approximately the same as said RF frequency.

17. The method of claim 9 wherein:

the RF bias power source is distinct from the RF power source that is coupled to the chamber.

18. The method of claim 1 wherein:

the RF bias power source is distinct from the RF source from which RF energy is inductively coupled to the plasma.

* * * * *

UNITED STATES PATENT AND TRADEMARK OFFICE
CERTIFICATE OF CORRECTION

PATENT NO.    : 6,537,421 B2
DATED         : March 25, 2003
INVENTOR(S)   : Drewery It is certified that error appears in the above-identified patent and that said Letters Patent is hereby corrected as shown below:

Column 4,
Line 36, beginning with "If the water bias" should not begin a new paragraph.

Column 5,
Lines 26, 34 and 39, reads "41a, 41b," should have three periods after the last comma as follows: -- 41a,41b,... --.

Signed and Sealed this

Twenty-eighth Day of October, 2003

JAMES E. ROGAN
*Director of the United States Patent and Trademark Office*